(12) United States Patent
Kwon

(10) Patent No.: US 9,985,012 B2
(45) Date of Patent: May 29, 2018

(54) DISPLAY APPARATUS AND A METHOD OF MANUFACTURING THE SAME

(71) Applicant: SAMSUNG DISPLAY CO., LTD., Yongin-si, Gyeonggi-Do (KR)

(72) Inventor: Jaejoong Kwon, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/461,695

(22) Filed: Mar. 17, 2017

(65) Prior Publication Data

US 2017/0271312 A1    Sep. 21, 2017

(30) Foreign Application Priority Data

Mar. 18, 2016  (KR) .................. 10-2016-0032923

(51) Int. Cl.
*H01L 33/00* (2010.01)
*H01L 25/16* (2006.01)
*H01L 33/48* (2010.01)
*H01L 25/075* (2006.01)
*H01L 25/00* (2006.01)
*H01L 27/12* (2006.01)
*H01L 33/54* (2010.01)

(52) U.S. Cl.
CPC ........ *H01L 25/167* (2013.01); *H01L 25/0753* (2013.01); *H01L 25/50* (2013.01); *H01L 27/1218* (2013.01); *H01L 27/1248* (2013.01); *H01L 33/486* (2013.01); *H01L 33/54* (2013.01); *H01L 2251/5338* (2013.01)

(58) Field of Classification Search
CPC ..................... H01L 33/486; H01L 2251/5338; H01L 33/54
See application file for complete search history.

(56) References Cited

U.S. PATENT DOCUMENTS

| | | | |
|---|---|---|---|
| 2002/0001046 A1 | 1/2002 | Jacobsen et al. | |
| 2007/0085103 A1* | 4/2007 | Nishioka | H01L 33/507 257/99 |
| 2011/0220927 A1* | 9/2011 | Min | H01L 25/0753 257/91 |
| 2014/0159064 A1 | 6/2014 | Sakariya et al. | |
| 2015/0263235 A1 | 9/2015 | Shin et al. | |
| 2016/0131350 A1* | 5/2016 | Li | H05K 1/021 362/294 |
| 2017/0221870 A1* | 8/2017 | Min | H01L 25/105 |

FOREIGN PATENT DOCUMENTS

KR  10-2005-0005688  1/2005
KR  10-2015-0108478  9/2015

* cited by examiner

*Primary Examiner* — Ngan Ngo
(74) *Attorney, Agent, or Firm* — F. Chau & Associates, LLC

(57) ABSTRACT

A display apparatus includes a flexible substrate, a light-emitting diode (LED), and a partitioning wall pattern. The flexible substrate includes a concavo-convex portion. The flexible substrate has a first elasticity. The LED is disposed on the concavo-convex portion. The partitioning wall pattern substantially surrounds the LED at a predetermined distance from the LED in a plan view. The partitioning wall pattern has a second elasticity less than the first elasticity.

8 Claims, 14 Drawing Sheets

DISPLAY APPARATUS AND A METHOD OF MANUFACTURING THE SAME

CROSS-REFERENCE TO RELATED APPLICATION

This application claims priority under 35 U.S.C. § 119 to Korean Patent Application No. 10-2016-0032923, filed on Mar. 18, 2016 in the Korean Intellectual Property Office, the disclosure of which is incorporated by reference herein in its entirety.

TECHNICAL FIELD

One or more exemplary embodiments of the present invention relate to a display apparatus, and more particularly to a method of manufacturing the same.

DISCUSSION OF RELATED ART

A light-emitting diode (LED) may transform an electric signal into a light beam, such as an infrared ray or a visible ray, based on the characteristics of a compound semiconductor. LEDs may be applied to household appliances, remote controllers, electronic displays, and various automation devices. LEDs have been widely utilized in electronic apparatuses from small handheld electronic apparatuses to large display apparatuses.

SUMMARY

One or more exemplary embodiments of the present invention provide a display apparatus with an increased optical efficiency. The display apparatus may be manufactured in a relatively simplified manufacturing process.

One or more exemplary embodiments of the present invention provide a display apparatus. The display apparatus includes a flexible substrate, a light-emitting diode (LED) and a partitioning wall pattern. The flexible substrate includes a concavo-convex portion. The flexible substrate has a first elasticity. The LED is disposed on the concavo-convex portion. The partitioning wall pattern substantially surrounds the LED at a predetermined distance from the LED in a plan view. The partitioning wall patter has a second elasticity smaller than the first elasticity.

A portion of the concavo-convex portion may be concavely recessed. The LED may be disposed on the concavely recessed portion of the concavo-convex portion.

The partitioning wall pattern may be disposed on the concavo-convex portion.

The partitioning wall pattern may have a closed loop-like shape or a closed polygonal shape substantially surrounding the LED in a plan view.

The display apparatus may further include a thin-film transistor. The thin film transistor may be above the flexible substrate. The thin film transistor may be electrically connected to the LED. The partitioning wall pattern may be positioned on a protruding portion of the concavo-convex portion.

The display apparatus may further include a thin-film transistor. The thin film transistor may be above the flexible substrate. The thin film transistor may be electrically connected to the LED. The partitioning wall pattern may include a metal material or a polymer material.

One or more exemplary embodiments of the present invention provide a method of manufacturing a display apparatus. The method includes elongating a flexible substrate by applying a physical force thereto. A plurality of light-emitting diodes (LEDs) are disposed on the elongated flexible substrate. A plurality of partitioning wall patterns are formed to substantially surround the plurality of LEDs in a plan view. The flexible substrate is contracted by removing the physical force.

In the contracting of the flexible substrate, a plurality of concavo-convex portion may be formed. The plurality of LEDs may be respectively disposed on the plurality of LEDs may be formed.

The plurality of partitioning wall patterns may be respectively disposed on the plurality of concavo-convex portions.

The plurality of partitioning wall patterns may have a closed loop-like shape or a closed polygonal shape substantially surrounding the plurality of LEDs in a plan view.

The method may further include forming a plurality of thin-film transistors above the flexible substrate. The thin film transistors may be electrically connected to the partitioning wall patterns.

The plurality of partitioning wall patterns may be respectively disposed at boundaries between the plurality of concavo-convex portion.

In the forming of the plurality of partitioning wall patterns, the plurality of partitioning wall patterns may be disposed at a predetermined distance apart from one another.

In the elongating of the flexible substrate, the flexible substrate may be elongated by applying the physical force in directions in which a first axis and a second axis crossing the first axis extend.

In the elongating of the flexible substrate, the flexible substrate may be elongated by applying substantially a same or a different physical force in the extending directions of the first axis and the second axis.

In the forming of the plurality of partitioning wall patterns, the plurality of partitioning wall patterns may include a material less elastic than a material included in the flexible substrate.

In the forming of the plurality of partitioning wall patterns, the plurality of partitioning wall patterns may include a metal material or a polymer material.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
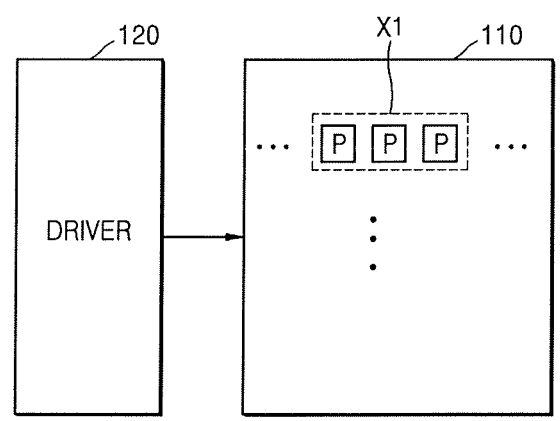
FIG. 1 is a schematic plan view illustrating a display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

FIG. 1 is a schematic plan view illustrating a display apparatus according to an exemplary embodiment of the present invention.

Referring to FIG. 1, a display apparatus 1 may include a display 110 and a driver 120. The display 110 may include a plurality of pixels P. The pixels P may be arranged on a substrate, for example, in a matrix shape. The driver 120 may include a scan driver and a data driver. The scan driver may be configured to apply a scan signal to a scan line. The scan line may be connected to the pixels P. The data driver may be configured to apply a data signal to a data line. The data line may be connected to the pixels P. The driver 120 may be disposed in a non-display area of the substrate. The non-display area may be disposed around the display 110. The pixels P may be arranged on the display 110. The driver 120 may be an integrated circuit chip directly disposed on the substrate having disposed thereon the display 110. The driver 120 may be disposed on a flexible printed circuit film. The driver 120 may be attached onto the substrate via a tape carrier package (TCP). The driver 120 may be directly disposed on the substrate.

Figure 2A:
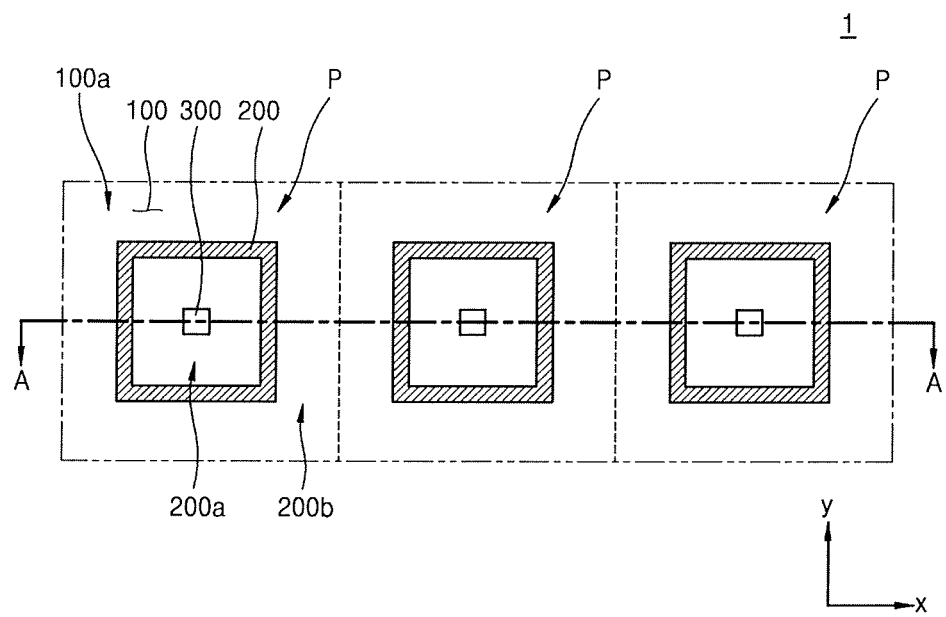
FIG. 2A is a magnified plan view illustrating a portion of a display apparatus of FIG. 1 according to an exemplary embodiment of the present invention.
Figure 2B:
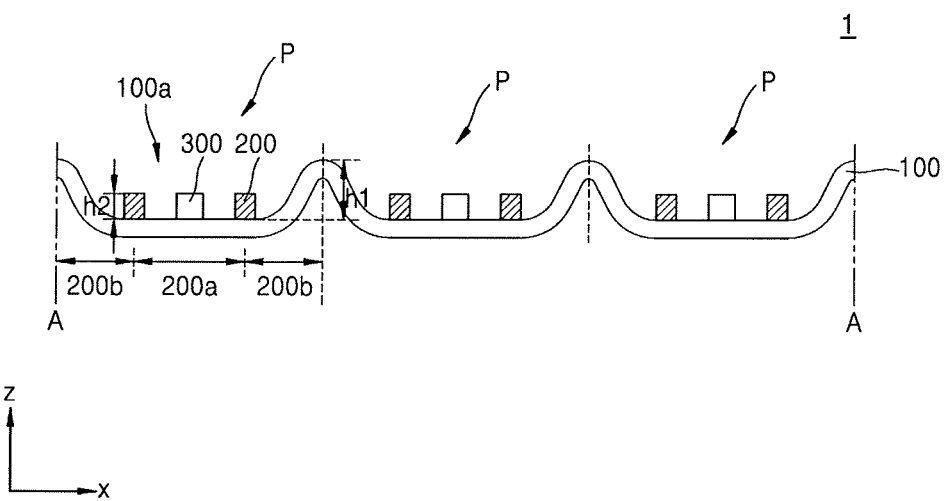
FIG. 2B is a schematic cross-sectional view illustrating a display apparatus of FIG. 2A taken along a line A-A according to an exemplary embodiment of the present invention.

FIG. 2A is a magnified plan view illustrating a portion of a display apparatus of FIG. 1 according to an exemplary embodiment of the present invention. FIG. 2B is a schematic cross-sectional view illustrating a display apparatus taken along a line A-A according to an exemplary embodiment of the present invention.

Referring to FIGS. 2A and 2B, a portion X1 of the display apparatus 1 may include a flexible substrate 100 and a light-emitting diode (LED) 300. The LED 300 may be disposed on the flexible substrate 100. The flexible substrate 100 may have a concavo-convex portion 100a and a partitioning wall pattern 200.

The flexible substrate 100 may include a flexible plastic. The flexible plastic may have a relatively high heat resistance and a relatively high durability. For example, the flexible substrate 100 may include polyethersulfone (PES), polyacrylate (PA), polyetherimide (PEI), polyethyelenen napthalate (PEN), polyethyelene terepthalate (PET), polyphenylene sulfide (PPS), polyarylate (PAR), polyimide (PI), polycarbonate (PC), cellulosetriacetate, cellulose acetate propionate (CAP), poly(aryleneether sulfone), silicon, PDMS, copolymers, or any combination thereof.

The LED 300 may be disposed on the flexible substrate 100. The LED 300 may be directly disposed on the flexible substrate 100. Alternatively, various layers may be disposed on the flexible substrate 100 and the LED 300 may be disposed on the layers. For example, a thin-film transistor (TFT) may be disposed on the flexible substrate 100. A planarizing film may cover the TFT. A LED may be disposed on the planarizing film. The LED 300 may be disposed directly on the flexible substrate 100; however, exemplary embodiments of the present invention are not limited thereto.

According to an exemplary embodiment of the present invention, the flexible substrate 100 may include the concavo-convex portion 100a. The flexible substrate 100 may include a plurality of concavo-convex portions.

According to an exemplary embodiment of the present invention, the concavo-convex portion 100a may include a center portion. The center portion may be concavely recessed. Heights of portions of the concavo-convex portion 100a substantially surrounding the center portion of the concavo-convex portion 100a when viewed from a plan view may be greater than a height of the center portion. Thus, the flexible substrate 100 may include a concave center portion. The shape of the flexible substrate 100 may be an embossed shape. Alternatively, the concavo-convex portion 100a may have a bowl-like shape with the concave center portion. Referring to FIG. 2A, the concavo-convex portion 100a may have a rectangular shape; however, exemplary embodiments of the present invention are not limited thereto. The concavo-convex portion 100a may have various shapes including, for example, a polygonal shape, a circular shape, an elliptical shape, or a cone shape.

The partitioning wall pattern 200 may be disposed in the concavo-convex portion 100a of the flexible substrate 100. The center portion of the concavo-convex portion 100a may be a concave portion recessed in a concave shape. Thus, the partitioning wall pattern 200 may be disposed in the concave portion. The partitioning wall pattern 200 may be disposed around the LED 300. The partitioning wall pattern 200 may substantially surround the LED 300 when viewed from a plan view. The partitioning wall pattern 200 may be disposed at a certain distance apart from the LED 300 in the concavo-convex portion 100a in which the LED 300 is disposed.

The partitioning wall pattern 200 may include a material that is less elastic than a material included in the flexible substrate 100. The partitioning wall pattern 200 may include a metal or a polymer material. The partitioning wall pattern 200 that is less elastic than the flexible substrate 100 may be relatively rigid in comparison to the flexible substrate 100.

According to an exemplary embodiment of the present invention, the partitioning wall pattern 200 may have a closed loop shape or a closed polygonal shape substantially surrounding the LED 300 when viewed from a plan view. Around the partitioning wall pattern 200, elasticity of a portion of the flexible substrate 100 in an inner portion 200a of the partitioning wall pattern 200 may be different from elasticity of a portion of the flexible substrate 100 in an outer portion 200b of the partitioning wall pattern 200. Thus, the elasticity of the portion of the flexible substrate 100 in the inner portion 200a of the partitioning wall pattern 200 may be greater than the elasticity of the portion of the flexible substrate 100 in the outer portion 200b of the partitioning wall pattern 200. The partitioning wall pattern 200 having a closed loop shape or a closed polygonal shape may maintain an elongated state of the portion of the flexible substrate 100 in the inner portion 200a of the partitioning wall pattern 200.

The inner portion 200a and the outer portion 200b of the partitioning wall pattern 200 may have different shapes. Referring to FIG. 2B, the inner portion 200a of the partitioning wall pattern 200 may have a substantially flat shape, whereas the outer portion 200b of the partitioning wall pattern 200 may have a shape rising in an upward direction (e.g., the positive Z-axis direction).

The LED 300 may be disposed in the concavo-convex portion 100a of the flexible substrate 100. The LED 300 may be disposed inside the inner portion 200a of the partitioning wall pattern 200 positioned in the concavo-convex portion 100a of the flexible substrate 100. The LED 300 may be positioned at the center portion of the concavo-convex portion 100a of the flexible substrate 100, where the partitioning wall pattern 200 may be disposed to substantially surround the LED 300 when viewed from a plan view.

Referring to FIG. 2B, height h1 of the uppermost portion of the concavo-convex portion 100a may be greater than height h2 of the partitioning wall pattern 200. Referring to FIGS. 2A and 2B, the LED 300 may be disposed directly on the flexible substrate 100. Thus the height of the LED 300 may be similar to the height h2 of the partitioning wall pattern 200. However, devices and layers including the same may be disposed between the flexible substrate 100 and the LED 300 and the LED 300 may be disposed thereon. Thus, the height h2 of the partitioning wall pattern 200 may have cause relatively little influence on a direction in which light emitted by the LED 300 travels.

Accordingly, in the display apparatus 1 according to an exemplary embodiment of the present invention, since the flexible substrate 100 includes the concavo-convex portion 100a, an efficiency of light emitted by the LED 300 may be increased without disposing a separate reflective structure on the flexible substrate 100.

Figure 3:
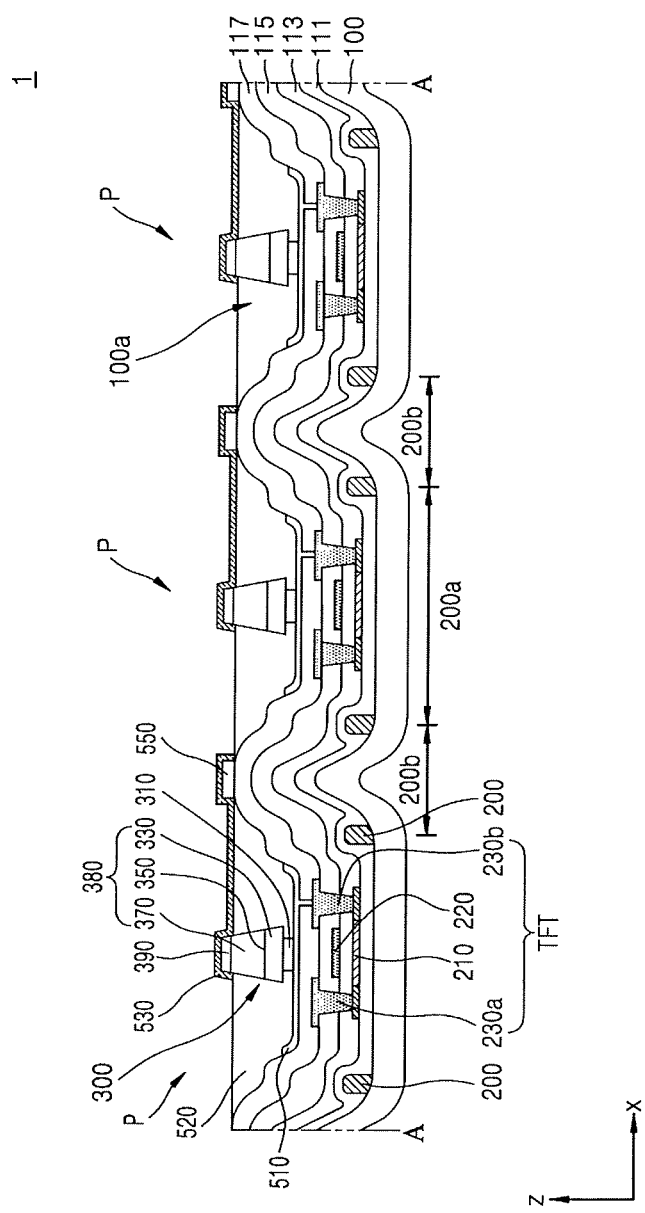
FIG. 3 is a schematic cross-sectional view illustrating a display apparatus of FIG. 2A taken along a line A-A according to an exemplary embodiment of the present invention.

FIG. 3 is a schematic sectional view illustrating a display apparatus taken along a line A-A of FIG. 2A according to an exemplary embodiment of the present invention.

Referring to FIG. 3, each pixel P may include the LED 300 and a pixel circuit. The pixel circuit may be connected to the LED 300. The pixel circuit may include at least one thin-film transistor TFT and at least one capacitor. The pixel circuit may be connected to a scan line and a data line. The scan line and the data line may intersect each other. One thin-film transistor TFT may be included per pixel P; however, exemplary embodiments of the present invention are not limited thereto.

The flexible substrate 100 may include the concavo-convex portion 100a. The flexible substrate 100 having the concavo-convex portion 100a does not mean that layers are formed on the flexible substrate 100. The layers may be patterned to provide the concavo-convex portion 100a. For example, the flexible substrate 100 may include the concavo-convex portion 100a. The center portion of the concavo-convex portion 100a may be concavely recessed. The portion of the concavo-convex portion 100a substantially surrounding the center portion of the concavo-convex portion 100a when viewed from a plan view may be relatively thicker than the center portion of the concavo-convex portion 100a.

The partitioning wall pattern 200 may be disposed on the flexible substrate 100. The partitioning wall pattern 200 may be disposed in the concavo-convex portion 100a of the flexible substrate 100. The concavo-convex portion 100a may include a first portion corresponding to the inner portion 200a of the partitioning wall pattern 200. The convo-convex portion 100a may include a second portion corresponding to the outer portion 200b of the partitioning wall pattern 200. The first portion may have an overall flat shape. The second portion may have a shape rising in an upward direction (e.g., the positive Z-axis direction).

A buffer layer 111 may be disposed on the flexible substrate 100. The thin-film transistor TFT and the LED 300 may be disposed on the buffer layer 111.

The buffer layer 111 may reduce or prevent infiltration of impurity ions via the flexible substrate 100. The buffer layer 111 may planarize a surface of the flexible substrate 100. The buffer layer 111 may have a single layered structure or a multi-layered structure. The buffer layer 111 may include an inorganic material, such as a silicon nitride ($SiN_x$) and/or a silicon oxide ($SiO_x$).

The thin-film transistor TFT may include an active layer 210, a gate electrode 220, a source electrode 230a, and a drain electrode 230b. The active layer 210 may include a semiconductor material. The active layer 210 may include a channel area, a source area, and a drain area. The channel area may be disposed between the source area and the drain area. The gate electrode 220 may be disposed on the active layer 210. The gate electrode 220 may be disposed on the active layer 210 in a position corresponding to the channel area. The source electrode 230a and the drain electrode 230b may be electrically connected to the source area and the drain area of the active layer 210, respectively.

A first insulation layer 113 may be disposed between the active layer 210 and the gate electrode 220. The first insulation layer 113 may be a gate insulation layer. The first insulation layer 113 may include an inorganic insulation material. A second insulation layer 115 may be disposed between the gate electrode 220 and the source electrode 230a/drain electrode 230b. The second insulation layer 115 may be an interlayer insulation layer. A third insulation layer 117 may be disposed on the source electrode 230a/drain electrode 230b. The third insulation layer 117 may be a planarizing layer. The second insulation layer 115 and the third insulation layer 117 may each have a single layered structure or a multi-layered structure. The single layered structure may include an organic insulation material or an inorganic insulation material. The multi-layered structure may include organic insulation material layers and inorganic insulation material layers alternatively stacked.

FIG. 3 illustrates a top gate type thin-film transistor TFT in which a gate electrode is disposed over an active layer. However, exemplary embodiments of the present invention are not limited thereto. For example, a gate electrode may be disposed below an active layer.

According to an exemplary embodiment of the present invention, the thin-film transistor TFT may be disposed over a first portion of the flexible substrate 100 corresponding to the inner portion 200a of the partitioning wall pattern 200. The second portion of the flexible substrate 100 corresponding to the outer portion 200b of the partitioning wall pattern 200 may have an overall flat shape. Thus circuit devices, such as the thin-film transistor TFT, may be disposed over the first portion of the flexible substrate 100 in a position corresponding to the inner portion 200a of the partitioning wall pattern 200.

According to an exemplary embodiment of the present invention, the buffer layer 111, the first insulation layer 113, the second insulation layer 115, and the third insulation layer 117 that are disposed over the flexible substrate 100 may be conformably disposed along an upper surface of the concavo-convex portion 100a of the flexible substrate 100. Therefore, the upper surface of the third insulation layer 117 may have a shape substantially the same as the shape of the upper surface of the concavo-convex portion 100a of the flexible substrate 100.

A first electrode 510 may be disposed along the upper surface of the third insulation layer 117 over the portion of the flexible substrate 100 corresponding to the inner portion 200a of the partitioning wall pattern 200. The first electrode 510 may be electrically connected to the source electrode 230a or the drain electrode 230b of the thin-film transistor TFT via a via hole disposed in the third insulation layer 117. The first electrode 510 may be electrically connected to the drain electrode 230b; however, exemplary embodiments of the present invention are not limited thereto.

A conductive layer 550 electrically connected to the second electrode 530 may be disposed on a portion of the third insulation layer 117 corresponding to the uppermost portion of the concavo-convex portion 100a.

According to an exemplary embodiment of the present invention, at least some of the flexible substrate 100, the first insulation layer 113, the second insulation layer 115, and the third insulation layer 117 may include a light-reflective material or a light-scattering material. The flexible substrate 100 or the third insulation layer 117 each may directly reflect light emitted by the LED 300. The flexible substrate 100 or the third insulation layer 117 may include an insulation material. The insulation material may be semi-transparent or relatively opaque with respect to visible rays (e.g., light of wavelengths from about 380 nm to about 750 nm).

At least one of the flexible substrate 100, the first insulation layer 113, the second insulation layer 115, and the third insulation layer 117 may include a thermoplastic resin, a thermosetting resin, or an organic insulation material. The thermoplastic resin may include polycarbonate (PC), polyethylene terephthalate (PET), polyether sulfone, polyvinyl butyral, polyphenylene ether, polyimide, polyetherimide, norbornene system resin, methacrylic resin, or cyclic polyolefin. The thermosetting resin may include epoxy resin, phenol resin, urethane resin, acrylic resin, vinyl ester resin, imide resin, urea resin, or melamine resin. The organic insulation material may include polystyrene, polyacrylonitrile, or polycarbonate. However, exemplary embodiments of the present invention are not limited thereto. At least one of the first insulation layer 113, the second insulation layer 115, and the third insulation layer 117 may include an inorganic insulation material. The inorganic insulation material may include an inorganic oxide or an inorganic nitride, such as $SiO_x$, $SiN_x$, $SiN_xO_y$, $AlO_x$, $TiO_x$, $TaO_x$, or $ZnO_x$.

However, exemplary embodiments of the present invention are not limited thereto. According to an exemplary embodiment of the present invention, at least one of the flexible substrate 100, the first insulation layer 113, the second insulation layer 115, and the third insulation layer 117 may include a relatively highly-reflective distributed Bragg reflector (DBR) or a mirror reflector. The mirror reflector may include a metal.

The LED 300 may be disposed in the concavo-convex portion 100a of the flexible substrate 100. The LED 300 may be a micro-LED. The term 'micro' may refer to a scale from about 1 μm to about 100 μm. However, exemplary embodiments of the present invention are not limited thereto. The single LED 300 or the plurality of LEDs 300 may be picked up from a wafer by a transferring mechanism and transferred onto the flexible substrate 100. Thus the LED 300 may be disposed in the concavo-convex portion 100a of the flexible substrate 100. According to an exemplary embodiment of the present invention, the LED 300 may be accommodated in the concavo-convex portion 100a of the flexible substrate 100 after the first electrode 510 is disposed. According to an exemplary embodiment of the present invention, the LED 300 may be accommodated in the concavo-convex portion 100a of the flexible substrate 100 by being transferred to the flexible substrate 100 after the conductive layer 550 is disposed. The LED 300 may be a red LED, a green LED, a blue LED, a white LED, or an UV LED.

The LED 300 may include a p-n diode 380, a first contact electrode 310, and a second contact electrode 390. The first contact electrode 310 and/or the second contact electrode 390 may have a single layered structure or a multi-layered structure. The first contact electrode 310 and/or the second contact electrode 390 may include one of various conductive materials including metals, conductive oxides, or conductive copolymers. The first contact electrode 310 and the second contact electrode 390 may include a reflective layer, for example, a silver (Ag) layer. The first contact electrode 310 may be electrically connected to the first electrode 510. The second contact electrode 390 may be electrically connected to the second electrode 530. The p-n diode 380 may include a p-doped layer 330. The p-doped layer 330 may include the lower portion of the p-n diode 380. The p-n diode 380 may include one or more quantum well layers 350 and an upper n-doped layer 370. The n-doped layer may include the upper portion of the p-n diode 380. According to an exemplary embodiment of the present invention, the upper portion of the p-n diode 380 may be a p-doped layer. The lower portion of the p-n diode 380 may be an n-dope layer. The sidewall of the p-n diode 380 may have a substantially straight shape, a downwardly tapered shape, or an upwardly tapered shape.

The first electrode 510 may be a reflective electrode. The first electrode 510 may include one or more layers. For example, the first electrode 510 may include a metal, such as aluminum, molybdenum, titanium, tungsten, silver, gold, or an alloy thereof. The first electrode 510 may include a transparent conductive layer and a reflective layer. The transparent conductive layer may include a transparent conductive oxide (TCO), such as ITO, IZO, ZnO, or $In_2O_3$. According to an exemplary embodiment of the present invention, the first electrode 510 may be a triple layered structure. The triple layered structure may include an upper transparent conductive layer, a lower transparent conductive layer, and a reflective layer. The reflective layer may be disposed between the upper transparent conductive layer and the lower transparent conductive layer. The second electrode 530 may be a transparent electrode or a semi-transparent electrode. For example, the second electrode 530 may include the a transparent conductive oxide (TCO), such as ITO, IZO, ZnO, or $In_2O_3$ and may include Ag, Al, Mg, Li, Ca, Cu, LiF/Ca, LiF/Al, MgAg, CaAg, or any combination thereof.

A passivation layer 520 may be disposed in the concavo-convex portion 100a of the flexible substrate 100. The passivation layer 520 may substantially surround the LED 300 when viewed from a plan view. A portion of the passivation layer 520 may be positioned in the concavo-convex portion 100a. The passivation layer 520 may substantially fill spaces between adjacent LEDs 300. Thus, the passivation layer 520 may substantially cover each of the concavo-convex portion 100a and the first electrode 510.

The passivation layer 520 may include an organic insulation layer. For example, the passivation layer 520 may include acryl, poly(methyl methacrylate) (PMMA), benzocyclobutene (BCB), polyimide, acrylate, epoxy, or polyester. However, exemplary embodiments of the present invention are not limited thereto. The passivation layer 520 may be disposed with a width insufficient to cover the upper portion of the LED 300. Thus the second contact electrode 390 may be exposed. The second electrode 530 may be electrically connected to each of the exposed second contact electrode 390 of the LED 300 and the conductive layer 550. The second electrode 530 may be disposed on the passivation layer 520.

The LED 300 described with reference to FIG. 3 may be a vertical-type micro-LED; however, exemplary embodiments of the present invention are not limited thereto. For example, a flip-type micro-LED or a horizontal-type micro-LED, in which a first contact electrode and a second contact electrode are disposed in a same direction, may be used. A first electrode and a second electrode may be disposed in correspondence to the first contact electrode and the second contact electrode, respectively.

Figure 4:
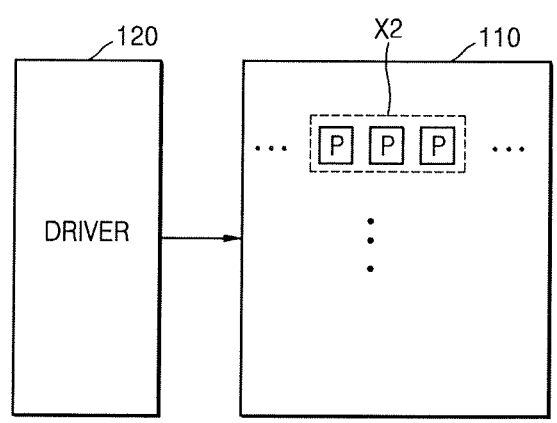
FIG. 4 is a schematic plan view illustrating a display apparatus according to an exemplary embodiment of the present invention.

FIG. 4 is a schematic plan view illustrating a display apparatus according to an exemplary embodiment of the present invention.

Referring to FIG. 4, a display apparatus 2 may include the display 110 and the driver 120. The display 110 may include a plurality of pixels P. The pixels P may be arranged on a substrate, for example, in a matrix-like shape. The driver 120 may include a scan driver and a data driver. The scan driver may be configured to apply a scan signal to a scan line. The scan line may be connected to the pixels P. The data driver may be configured to apply a data signal to a data line. The data line may be connected to the pixel PX. The driver 120 may be disposed in a non-display area of the substrate. The non-display area may be disposed around the display 110. The pixels P may be arranged on the display 110. The driver 120 may be an integrated circuit chip directly disposed on the substrate having disposed thereon the display 110. The driver 110 may be disposed on a flexible printed circuit film. The driver 110 may be attached onto the substrate in the form of a tape carrier package (TCP). The driver 110 may be directly disposed on the substrate.

Figure 5A:
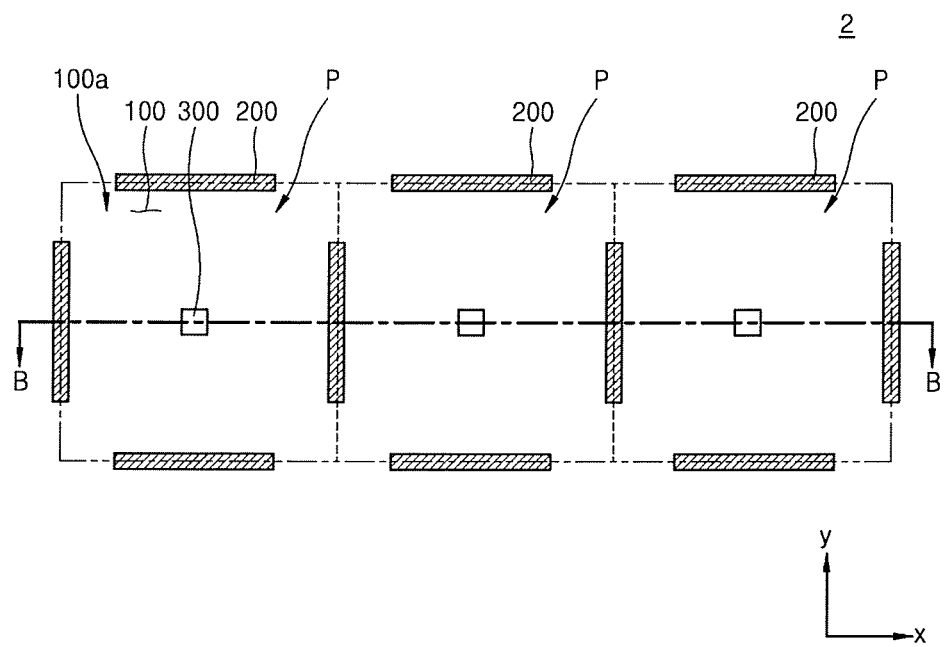
FIG. 5A is a magnified plan view illustrating a portion of a display apparatus of FIG. 4 according to an exemplary embodiment.
Figure 5B:
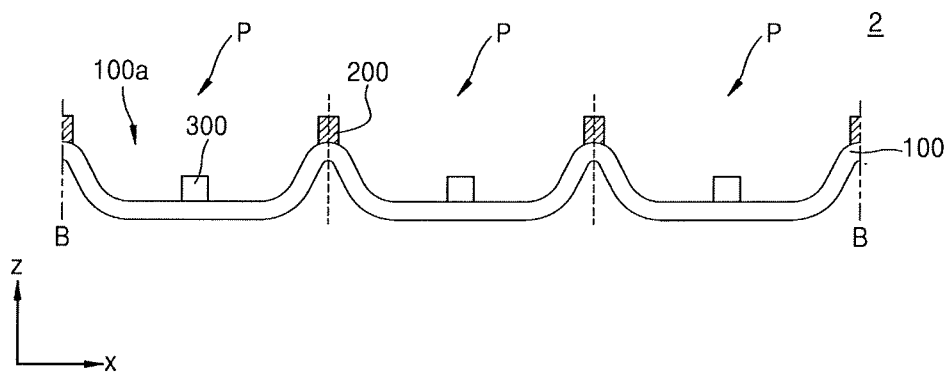
FIG. 5B is a schematic cross-sectional view illustrating a display apparatus of FIG. 5A taken along a line B-B according to an exemplary embodiment of the present invention.

FIG. 5A is a magnified plan view illustrating a portion of a display apparatus of FIG. 4 according to an exemplary embodiment of the present invention. FIG. 5B is a schematic sectional view illustrating a display apparatus of FIG. 5A taken along a line B-B according to an exemplary embodiment of the present invention.

Referring to FIGS. 5A and 5B, a portion X2 of the display apparatus 2 may include the flexible substrate 100, the partitioning wall pattern 200, and the light-emitting diode (LED) 300. The partitioning wall pattern 200 may be disposed on the flexible substrate 100. The LED 300 may be disposed on the flexible substrate 100. In the display apparatus 2, the partitioning wall pattern 200 may include portions spaced apart from one another. Thus, the partitioning wall pattern 200 may differ from a partitioning wall pattern might not have a closed loop-shape.

The flexible substrate 100 may include an elastic plastic material. The elastic plastic material may have a relatively high heat resistance and a relatively high durability.

The LED 300 may be disposed on the flexible substrate 100. The LED 300 may be disposed directly on the flexible substrate 100. Alternatively, various layers may be disposed on the flexible substrate 100 and the LED 300 may be disposed on such layers. For example, a thin-film transistor TFT may be disposed on the flexible substrate 100, a planarizing layer may be disposed to substantially cover the thin-film transistor TFT, and the LED 300 may be disposed on the planarizing layer. FIGS. 5A and 5B illustrate that the LED 300 is disposed directly on the flexible substrate 100.

According to an exemplary embodiment of the present invention, the flexible substrate 100 may include the concavo-convex portion 100a. The flexible substrate 100 may also include a plurality of concavo-convex portions 100a.

According to an exemplary embodiment of the present invention, the concavo-convex portion 100a may have a shape in which the center portion is concavely recessed. Heights of portions of the concavo-convex portion 100a substantially surrounding the center portion of the concavo-convex portion 100a when viewed from a plan view may be greater than a height of the center portion. Therefore, the flexible substrate 100 may include a concave portion. The flexible substrate 100 may have an embossed shape or the concavo-convex portion 100a may have a bowl-like shape with the concave center portion. The concavo-convex portion 100a may have a rectangular shape; however, exemplary embodiments of the present invention are not limited thereto. The concavo-convex portion 100a may have one of various shapes including polygonal shapes, circular shapes, elliptical shapes, or cone-like shapes.

The partitioning wall pattern 200 may be disposed at boundaries between the concavo-convex portion 100a of the flexible substrate 100. The concavo-convex portion 100a may include a concavely recessed center portion. The concavo-convex portion 100a may have a shape protruding in an upward direction (e.g., the positive Z-axis direction) from the center portion to edge portions. According to an exemplary embodiment of the present invention, the partitioning wall pattern 200 may be disposed at the uppermost portions of the concavo-convex portion 100a. The partitioning wall pattern 200 may partially surround the LED 300 when viewed from a plan view. According to an exemplary embodiment of the present invention, the partitioning wall pattern 200 may be disposed at portions around the LED 300 when viewed from a plan view. The partitioning wall pattern 200 may be located a certain distance apart from the LED 300 in the concavo-convex portion 100a in which the LED 300 is positioned. A distance at which portions of the partitioning wall pattern 200 are apart from the LED 300 may vary according to sizes or distances between portions of the partitioning wall pattern 200. Therefore, the portions of the partitioning wall pattern 200 may be disposed relatively close to one another or may directly contact one another.

The partitioning wall pattern 200 may be disposed at boundaries between the concavo-convex portion 100a of the flexible substrate 100. The uppermost portion of the concavo-convex portion 100a of the flexible substrate 100 may be disposed in a direction toward the LED 300. The partitioning wall pattern 200 may include a material that is less elastic than a material included in the flexible substrate 100. For example, the partitioning wall pattern 200 may include a metal or a polymer material. Thus, the partitioning wall pattern 200 may be relatively rigid compared to the flexible substrate 100.

The LED 300 may be disposed in the concavo-convex portion 100a of the flexible substrate 100. According to an exemplary embodiment of the present invention, the LED 300 may be positioned at the center portion of the concavo-convex portion 100a of the flexible substrate 100. The partitioning wall pattern 200 may partially surround the LED 300 when viewed from a plan view.

The display apparatus 2 may increase efficiency of light emitted by the LED 300 based on the structure of the flexible substrate 100 including the concavo-convex portion 100a without a separate reflective structure disposed on the flexible substrate 100.

Figure 6:
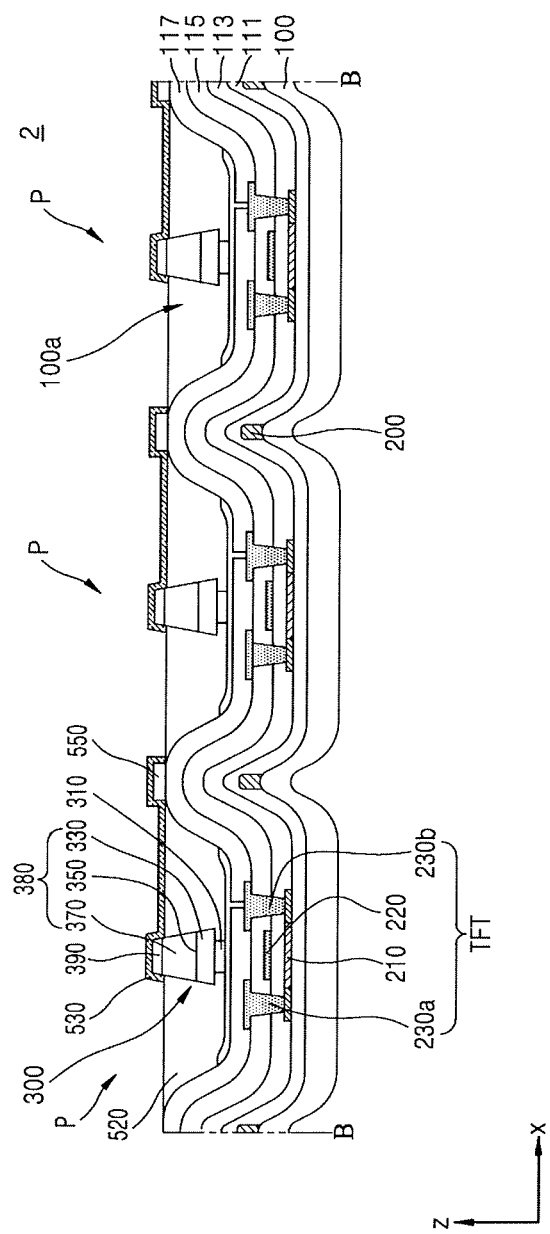
FIG. 6 is a schematic cross-sectional view illustrating a display apparatus of FIG. 5A taken along a line B-B according to an exemplary embodiment of the present invention.

FIG. 6 is a schematic sectional view illustrating a display apparatus of FIG. 5A taken along a line B-B according to an exemplary embodiment of the present invention.

Referring to FIG. 6, each pixel P may include the LED 300 and a pixel circuit connected to the LED 300. The display apparatus described with reference to FIG. 6 may be substantially the same as the display apparatus described with reference to FIG. 3, except for a position of the partitioning wall pattern 200 disposed on the flexible substrate 100. Thus, duplicative descriptions may be omitted, and differences between the display apparatuses will be focused on below.

The flexible substrate 100 may be shaped to form the concavo-convex portion 100a. The flexible substrate 100 might not include a plurality of patterned layers forming the concavo-convex portion 100a. The center portion of the concavo-convex portion 100a may be concavely recessed. The portion of the concavo-convex portion 100a substantially surrounding the center portion of the concavo-convex portion 100a when viewed from a plan view may be thicker than the center portion of the concavo-convex portion 100a.

The partitioning wall pattern 200 may be disposed on the flexible substrate 100. The partitioning wall pattern 200 may be disposed at the uppermost portion of the concavo-convex portion 100a of the flexible substrate 100 in a direction toward the LED 300. The portion of the flexible substrate 100 with the partitioning wall pattern 200 disposed thereon may be a highest portion of the flexible substrate along a +Z direction. A portion of the concavo-convex portion 100a of the flexible substrate 100 corresponding to the partitioning wall pattern 200 may have a shape protruding in an upward direction (e.g., the positive Z-axis direction). Therefore, the concavo-convex portion 100a of the flexible substrate 100 may become less steep in a direction away from the partitioning wall pattern 200. The center portion of the concavo-convex portion 100a may have a substantially flat shape.

The buffer layer 111 may be disposed on the flexible substrate 100. Each of the thin-film transistor TFT and the LED 300 may be disposed on the buffer layer 111.

The thin-film transistor TFT may include the active layer 210, the gate electrode 220, the source electrode 230a, and the drain electrode 230b. The active layer 210 may include the semiconductor material. The active layer 210 may include the channel area. The channel area may be disposed between the source area and the drain area. The gate electrode 220 may be disposed on the active layer 210 in correspondence to the channel area. The source electrode 230a and the drain electrode 230b may be electrically connected to the source area and the drain area of the active layer 210, respectively.

A first insulation layer 113 may be disposed between the active layer 210 and the gate electrode 220. The first insulation layer 113 may be a gate insulation layer. The first insulation layer 113 may include an inorganic insulation material. The second insulation layer 115 may be disposed between the gate electrode 220 and the source electrode 230a/drain electrode 230b. The second insulation layer 115 may be an interlayer insulation layer. The third insulation layer 117 may be disposed on the source electrode 230a/drain electrode 230b. The third insulation layer may be a planarizing layer. The second insulation layer 115 and the third insulation layer 117 may each include the organic insulation material or the inorganic insulation material. Alternatively, the second insulation layer 115 and the third insulation layer 117 may each include organic insulation material layers and inorganic insulation material layers alternatively stacked.

The TFT may be a top gate type thin-film transistor TFT in which a gate electrode is disposed over an active layer. However, exemplary embodiments of the present invention are not limited thereto. For example, a gate electrode may be disposed below an active layer.

According to an exemplary embodiment of the present invention, the thin-film transistor TFT may be disposed over a first portion of the flexible substrate 100 corresponding to the inner portion 200a of the partitioning wall pattern 200. Referring to FIG. 6, the thin-film transistor TFT may be disposed in a position corresponding to a substantially flat portion of the concavo-convex portion 100a of the flexible substrate 100. It may be relatively difficult to stably dispose circuit devices, such as the thin-film transistor TFT, on an uneven portion, such as the portion of the concavo-convex portion 100a of the flexible substrate 100 having disposed thereon the partitioning wall pattern 200. Thus, a defect may occur at a circuit device disposed on such a location. Therefore, the thin-film transistor TFT may be positioned between the concavo-convex portions 100a of the flexible substrate 100.

According to an exemplary embodiment of the present invention, the buffer layer 111, the first insulation layer 113, the second insulation layer 115, and the third insulation layer 117 that are disposed over the flexible substrate 100 may be conformably disposed along an upper surface of the surface of the concavo-convex portion 100a of the flexible substrate 100. Therefore, the upper surface of the third insulation layer 117 may have a shape substantially the same as the shape of the upper surface of the concavo-convex portion 100a of the flexible substrate 100. An operation for forming a layer, such as a pixel defining layer (PDL), that defines a pixel area may be omitted, and thus the overall manufacturing process may be simplified by using the shape of the concavo-convex portion 100a of the flexible substrate 100.

A first electrode 510 may be disposed along the upper surface of the third insulation layer 117 over the second portion of the flexible substrate 100 corresponding to the inner portion 200a of the partitioning wall pattern 200. The first electrode 510 may be electrically connected to the source electrode 230a or the drain electrode 230b of the thin-film transistor TFT via a via hole disposed in the third insulation layer 117. The first electrode 510 may be electrically connected to the drain electrode 230b.

A conductive layer 550 may be electrically connected to the second electrode 530. The conductive layer 500 may be disposed on a portion of the third insulation layer 117 corresponding to the uppermost portion of the concavo-convex portion 100a.

According to an exemplary embodiment of the present invention, at least one of the flexible substrate 100, the first insulation layer 113, the second insulation layer 115, and the third insulation layer 117 may include a light-reflective material or a light-scattering material. The flexible substrate 100 or the third insulation layer 117 may directly reflect light emitted by the LED 300. The flexible substrate 100 or the third insulation layer 117 may include an insulation material that is semi-transparent or relatively opaque with respect to visible rays (e.g., light of wavelengths from about 380 nm to about 750 nm). At least one of the flexible substrate 100, the first insulation layer 113, the second insulation layer 115, and the third insulation layer 117 may include a thermoplastic resin, a thermosetting resin, or an inorganic insulation material. The thermoplastic resin may include polycarbonate (PC), polyethylene terephthalate (PET), polyether sulfone, polyvinyl butyral, polyphenylene ether, polyamide, polyetherimide, norbornene system resin, methacrylic resin, or cyclic polyolefin. The thermosetting resin may include epoxy resin, phenol resin, urethane resin, acrylic resin, vinyl ester resin, imide resin, urea resin, or melamine resin. The organic insulation material may include polystyrene, polyacrylonitrile, or polycarbonate. However, exemplary embodiments of the present invention are not limited thereto. At least one of the first insulation layer 113, the second insulation layer 115, and the third insulation layer 117 may include an inorganic insulation material, The inorganic insulation material may include an inorganic oxide or an inorganic nitride, for example, $SiO_x$, $SiN_x$, $SiN_xO_y$, $AlO_x$, $TiO_x$, $TaO_x$, or $ZnO_x$. However, exemplary embodiments of the present invention are not limited thereto. According to an exemplary embodiment of the present invention, at least one of the flexible substrate 100, the first insulation layer 113, the second insulation layer 115, and the third insulation layer 117 may include a relatively highly-reflective distributed Bragg reflector (DBR) or a mirror reflector. The mirror reflector may include a metal.

The LED 300 may be disposed in the concavo-convex portion 100a of the flexible substrate 100. The LED 300 may be a micro-LED. The term 'micro' may refer to a scale from about 1 μm to about 100 μm. However, exemplary embodiments of the present invention are not limited thereto and may be applied to larger or smaller LEDs. The LED 300 may be a red LED, a green LED, a blue LED, a white LED, or an UV LED.

Figure 7A:
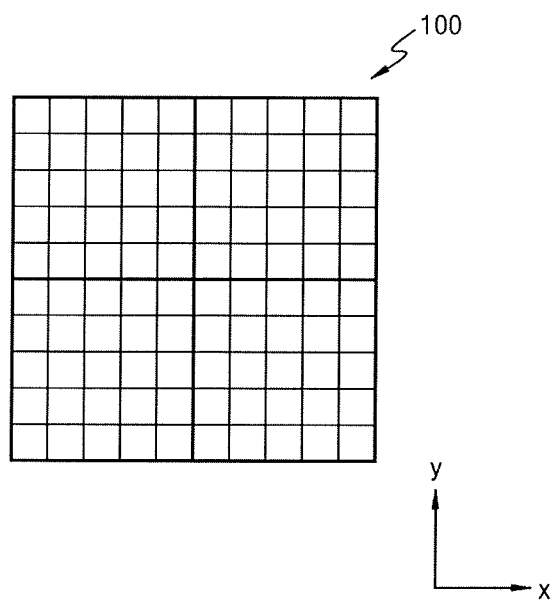
FIGS. 7A, 8A, 9A and 10A are schematic plan views illustrating a process of manufacturing the display apparatus described with reference to FIGS. 2A and 2B according to an exemplary embodiment of the present invention.
Figure 7B:
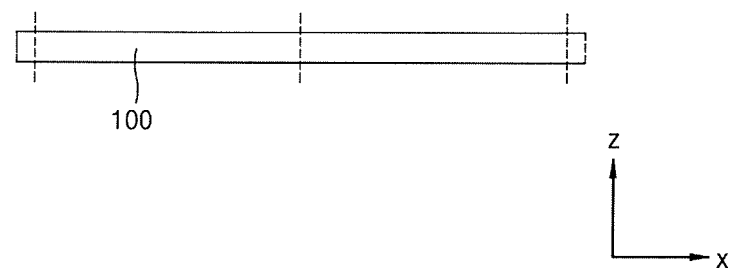
FIGS. 7B, 8B, 9B and 10B are cross-sectional views illustrating a process of manufacturing the display apparatus described with reference to FIGS. 2A and 2B according to an exemplary embodiment of the present invention.
Figure 8A:
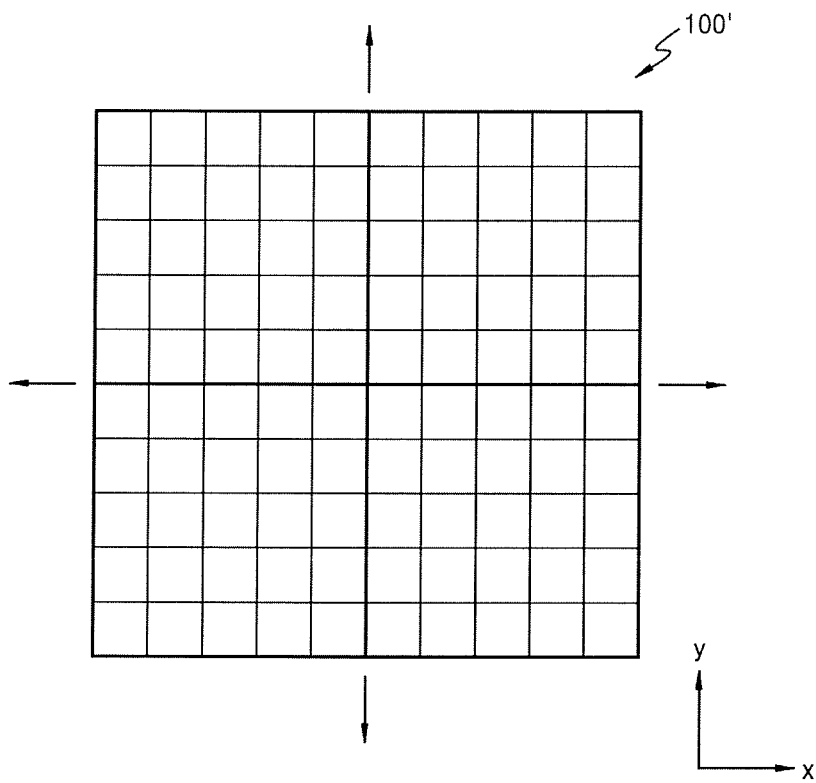
Figure 8B:
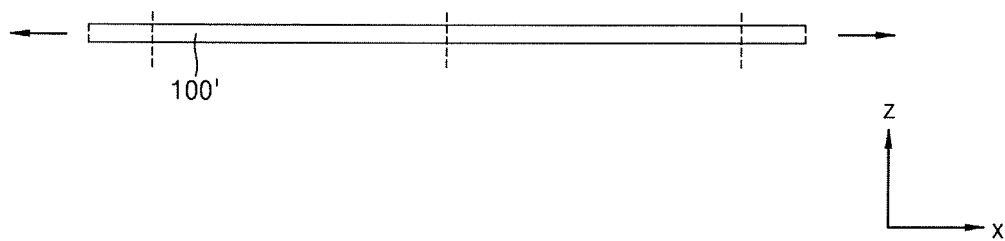

FIGS. 7A, 8 A, 9A and 10A are schematic plan views illustrating a process of manufacturing the display apparatus described with reference to FIGS. 2A and 2B according to an exemplary embodiment of the present invention. FIGS. 7B, 8B, 9B and 10B are cross-sectional views illustrating a process of manufacturing the display apparatus described with reference to FIGS. 2A and 2B according to an exemplary embodiment of the present invention.

Referring to FIGS. 7A and 7B, the flexible substrate 100 having elasticity may be provided. The flexible substrate 100 may include polyethersulfone (PES), polyacrylate (PA), polyetherimide (PEI), polyethyelenen napthalate (PEN), polyethyelene terepthalate (PET), polyphenylene sulfide (PPS), polyarylate (PAR), polyimide (PI), polycarbonate (PC), cellulosetriacetate, cellulose acetate propionate (CAP), poly(aryleneether sulfone), silicon, PDMS, copolymers, or any combination thereof.

The flexible substrate 100 may have a square shape; however, exemplary embodiments of the present invention are not limited thereto. The flexible substrate 100 may have various shapes including a rectangular shape, a non-rectangular polygonal shape, a circular shape, or an elliptical shape.

The flexible substrate 100 may include a relatively flexible portion and a relatively rigid portion.

Referring to FIGS. 8A and 8B, a flexible substrate 100' may be elongated by applying physical force thereto. The flexible substrate 100' may have elastic properties. The flexible substrate 100' may include an elastic material, and thus the flexible substrate 100' may be expanded by applying physical force thereto. Physical forces may be applied to the flexible substrate 100' in leftward, rightward, upward, and downward directions along the horizontal axis (e.g., the x-axis) and the vertical axis (e.g., the y-axis).

According to an exemplary embodiment of the present invention, physical forces may be applied to the flexible substrate 100' in directions along either the horizontal axis or the vertical axis. According to an exemplary embodiment of the present invention, physical forces applied in directions along the horizontal axis may be different from physical forces applied in directions along the vertical axis. Thus, the flexible substrate 100' is more elongated in directions along one of the axes.

In order to maintain area of the elongated flexible substrate 100', physical forces may be continuously applied to the flexible substrate 100' in order to prevent contraction of the flexible substrate 100' while devices described above are being disposed on the flexible substrate 100'.

Figure 9A:
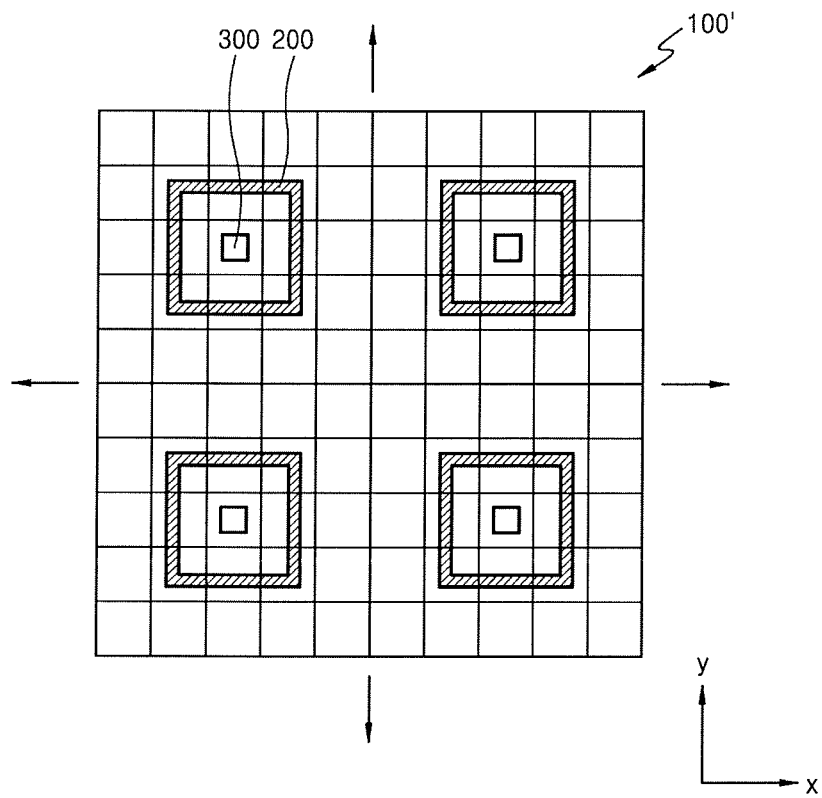
Figure 9B:
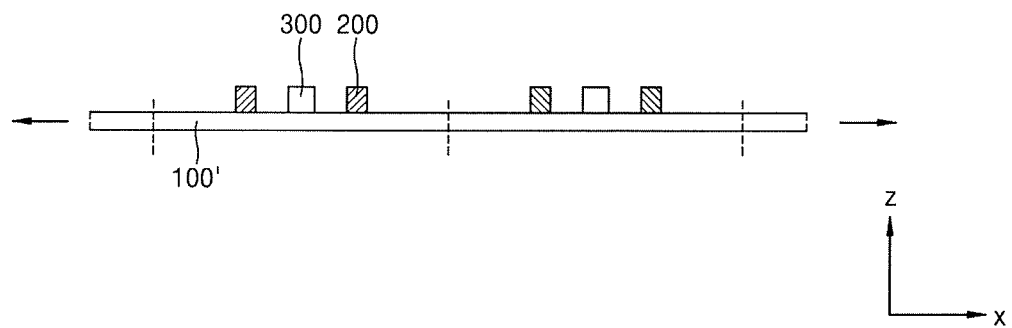

Referring to FIGS. 9A and 9B, a plurality of partitioning wall patterns 200 may be disposed on the elongated flexible substrate 100'. Furthermore, a plurality of LEDs 300 may be disposed on the elongated flexible substrate 100'. According to an exemplary embodiment of the present invention, the plurality of partitioning wall patterns 200 may be patterned onto the elongated flexible substrate 100'. Various layers may be disposed on the elongated flexible substrate 100'. The plurality of LEDs 300 may be mounted on the elongated flexible substrate 100'. The plurality of LEDs 300 may be mounted on the elongated flexible substrate 100' first. Alternatively, the plurality of partitioning wall patterns 200 may be disposed on the elongated flexible substrate 100' first.

FIGS. 9A, 9B, 10A, and 10B illustrate that the concavo-convex portion 100a may be disposed on the flexible substrate 100 by mounting the plurality of partitioning wall patterns 200 and the plurality of LEDs 300 on the elongated flexible substrate 100' and contracting the elongated flexible substrate 100'. However, the elongated flexible substrate 100' may be contracted after the plurality of partitioning wall patterns 200 are disposed on the elongated flexible substrate 100'. Various layers, circuit devices, such as a thin-film transistor TFT, and the plurality of LEDs 300 may be mounting on the flexible substrate 100.

The thin-film transistors TFT may each be electrically connected to a respective one of the plurality of LEDs 300 on the flexible substrate 100 (see, e.g., FIG. 3). The plurality of thin-film transistors TFT may each be in positions corresponding to the inner portions 200a of the partitioning wall patterns 200, respectively. Deformability of portions of the flexible substrate 100 corresponding to the inner portions 200a of the partitioning wall patterns 200 may be relatively small, and thus the thin-film transistors TFT may be stably disposed in the positions corresponding to the inner portions 200a.

Figure 10A:
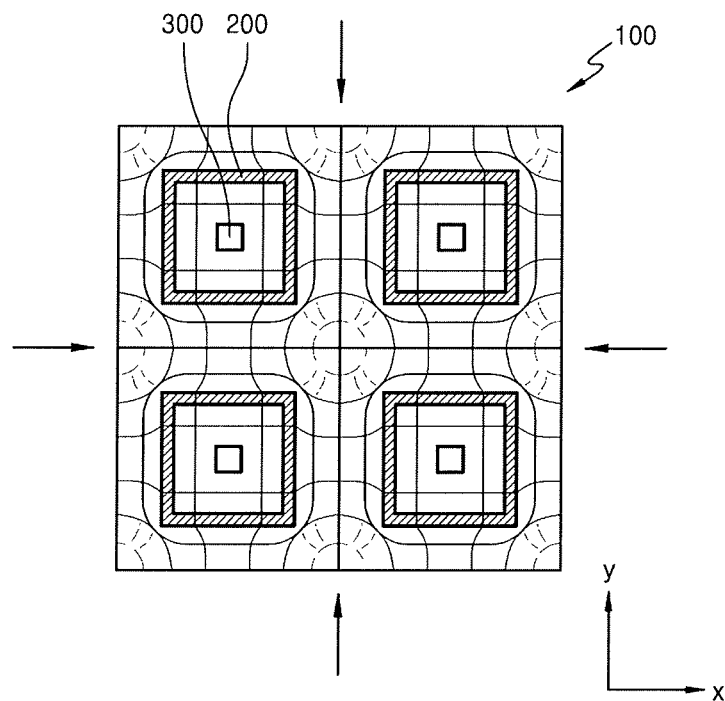
Figure 10B:
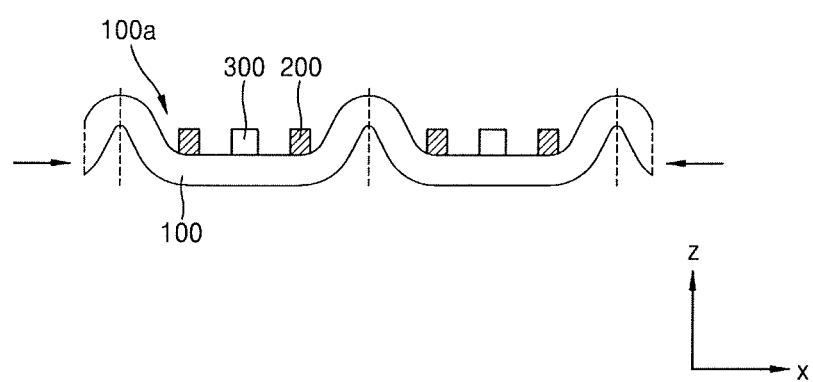
Figure 11A:
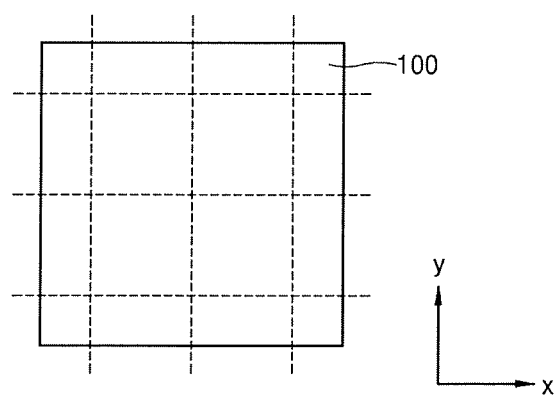
FIGS. 11A, 12A, 13A and 14A are schematic plan views illustrating a process of manufacturing the display apparatus described with reference to FIGS. 5A and 5B according to an exemplary embodiment of the present invention.
Figure 11B:
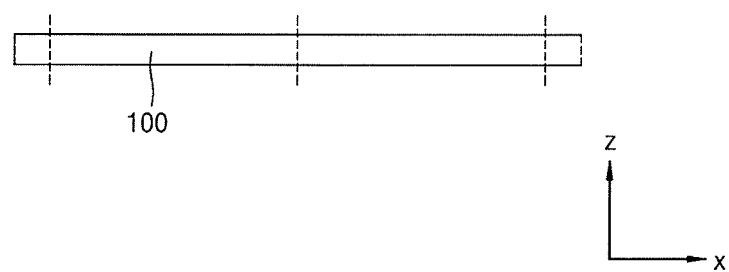
FIGS. 11B, 12B, 13B and 14B are cross-sectional views illustrating a process of manufacturing the display apparatus described with reference to FIGS. 5A and 5B according to an exemplary embodiment of the present invention.
Figure 12A:
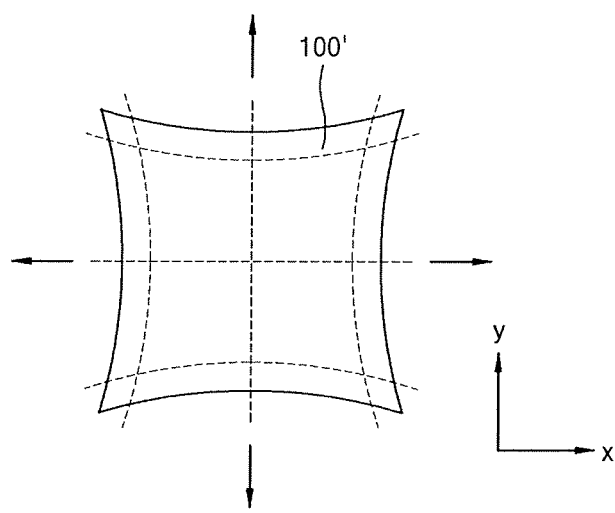
Figure 12B:
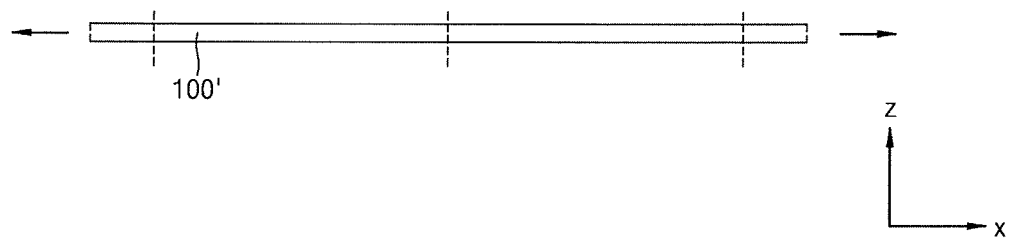

According to an exemplary embodiment of the present invention, the plurality of concavo-convex portions 100a may be defined on the flexible substrate 100 (see, e.g., FIGS. 10A and 10B), for example, by the plurality of partitioning wall patterns 200. Referring to FIGS. 10A and 10B, the plurality of partitioning wall patterns 200 may be disposed in the plurality of concavo-convex portions 100a, respectively. The plurality of partitioning wall patterns 200 may be formed to have a closed loop-like shape or a closed polygonal shape that substantially surround the plurality of LEDs 300, respectively when viewed from a plan view.

The partitioning wall patterns 200 may include a material that is less elastic than a material included in the flexible substrate 100. For example, the partitioning wall patterns 200 may include a metal or a polymer material. The partitioning wall patterns 200 may be less elastic than the flexible substrate 100, and may be relatively rigid as compared to the flexible substrate 100.

Referring to FIGS. 10A and 10B, the elongated flexible substrate 100' may be restored back to the flexible substrate 100 by removing physical forces applied to the elongated flexible substrate 100'. Portions of the flexible substrate 100 having the plurality of partitioning wall patterns 200 formed thereon might not be contracted. When the elongated flexible substrate 100' is restored back to the flexible substrate 100, elongations of the portions of the flexible substrate 100 corresponding to the inner portions 200a of the plurality of partitioning wall patterns 200 defined by the plurality of partitioning wall patterns 200 may be maintained. The plurality of partitioning wall patterns 200 that are less elastic than the flexible substrate 100 may maintain the elongations of the corresponding portions of the flexible substrate 100.

Therefore, the portions of the flexible substrate 100 corresponding to the inner portions 200a of the plurality of partitioning wall pattern 200 and the portions of the flexible substrate 100 corresponding to the outer portions 200b of the plurality of partitioning wall patterns 200 may have different shapes. Referring to FIG. 10B, the portions of the flexible substrate 100 corresponding to the inner portions 200a of the partitioning wall patterns 200 maintain an overall flat shape. The portions of the flexible substrate 100 corresponding to outer portions 200b of the partitioning wall patterns 200 may have a shape rising in an upward direction (e.g., the positive Z-axis direction).

The LEDs 300 may be disposed in the concavo-convex portions 100a of the flexible substrate 100. For example, the LEDs 300 may be disposed inside the inner portions 200a of the partitioning wall patterns 200 disposed in the concavo-convex portions 100a of the flexible substrate 100. The LEDs 300 may be disposed at the center portions of the concavo-convex portions 100a of the flexible substrate 100 where the partitioning wall patterns 200 may be disposed to substantially surround the LEDs 300 when viewed from a plan view.

A height h1 of the uppermost portions of the concavo-convex portions 100a may be greater than a height h2 of the partitioning wall patterns 200. Referring to FIGS. 10A and 10B, the LEDs 300 may be disposed directly on the flexible substrate 100. Thus, a height of the LEDs 300 may be similar to the height h2 of the partitioning wall patterns 200. However, devices and layers including the same may be disposed between the flexible substrate 100 and the LEDs 300. The LED 300s may be disposed on the intervening devices and layers. Thus, the height h2 of the partitioning wall patterns 200 may have relatively little influence to a direction in which light beams emitted by the LED 300s travel.

FIGS. 11A, 12A, 13A and 14A are schematic plan views illustrating a process of manufacturing the display apparatus described with reference to FIGS. 5A and 5B according to an exemplary embodiment of the present invention.

FIGS. 11B, 12B, 13B and 14B are cross-sectional views illustrating a process of manufacturing the display apparatus described with reference to FIGS. 5A and 5B according to an exemplary embodiment of the present invention.

Referring to FIGS. 11A, 11B, 12A, and 12B, the flexible substrate 100 having elasticity may be provided. The flexible substrate 100 may be elongated by applying physical forces thereto. Since the operations may be substantially the same as the operations described with reference to FIGS. 7A, 7B, 8A, and 8B. Thus, duplicative descriptions may be omitted, and differences between operations will be focused on below.

Referring to FIGS. 13A, 13B, 14A, and 14B, after the plurality of partitioning wall patterns 200 and the plurality of LEDs 300 are disposed on the elongated flexible substrate 100', the elongated flexible substrate 100' may be restored back to the original size of the flexible substrate 100 by removing physical forces applied to the elongated flexible substrate 100'. Thus, the plurality of concavo-convex portions 100a on the flexible substrate 100 may be formed. The plurality of LEDs 300 may be disposed after the plurality of partitioning wall patterns 200 are disposed on the elongated flexible substrate 100'. The plurality of partitioning wall patterns 200 may be disposed after the plurality of LEDs 300 are disposed. According to an exemplary embodiment of the present invention, a case where the plurality of LEDs 300 are disposed after the plurality of partitioning wall patterns 200 are disposed will be described in more detail below.

Figure 13A:
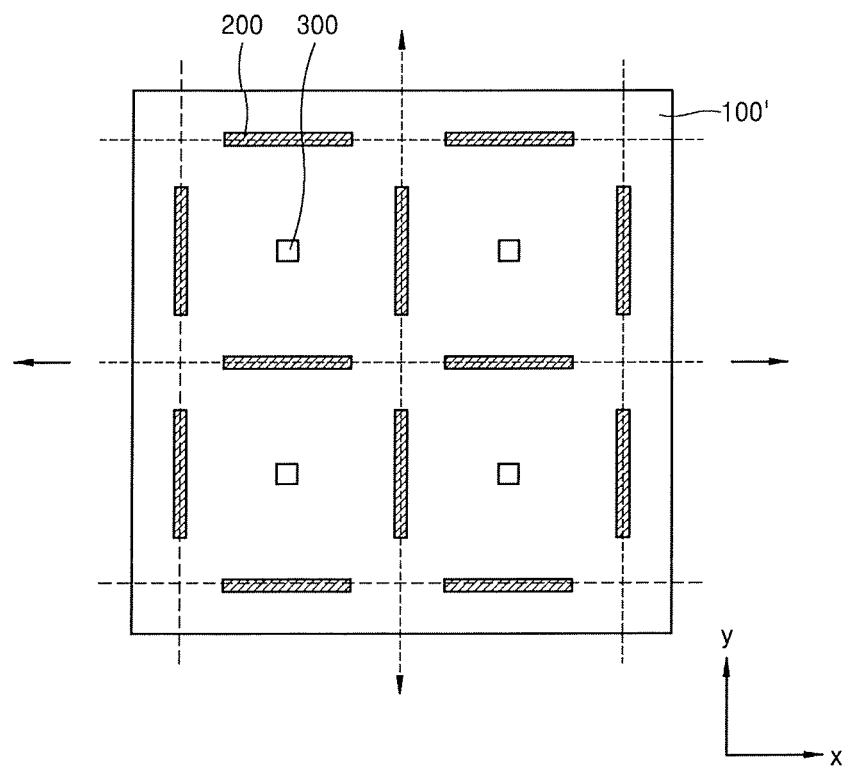
Figure 13B:
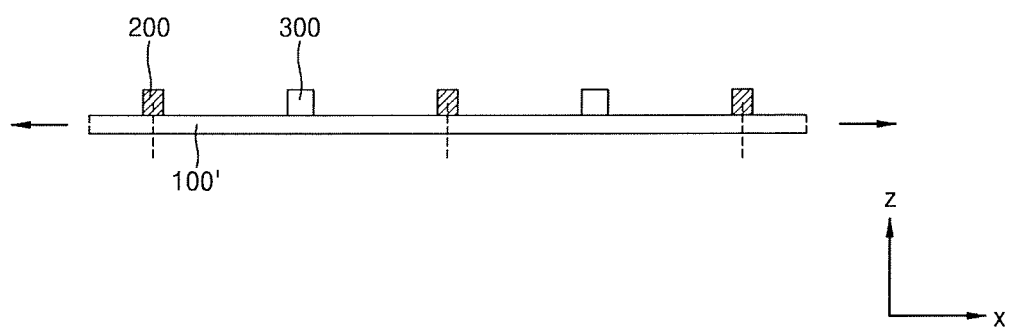
Figure 14A:
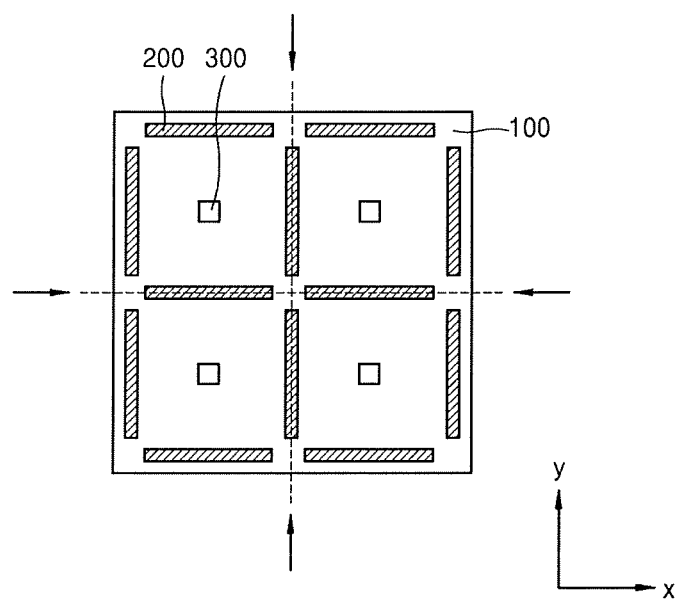
Figure 14B:
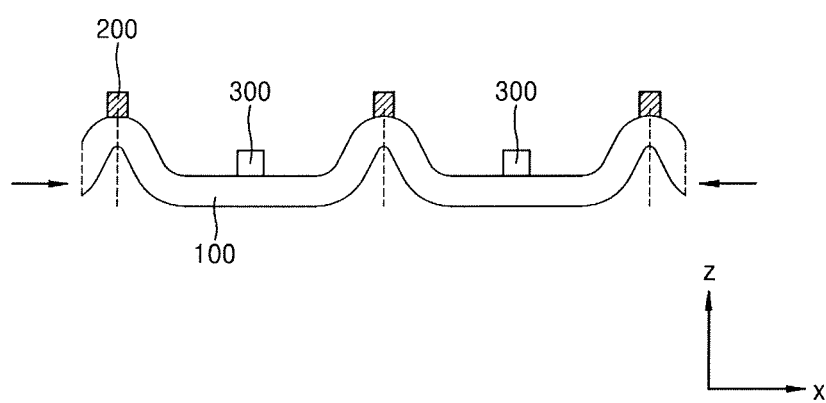

According to an exemplary embodiment of the present invention, each of the plurality of concavo-convex portions 100a may be defined as a pixel. The plurality of partitioning wall patterns 200 may be disposed at boundaries between the plurality of concavo-convex portions 100a. Referring to FIGS. 13A and 14A, the plurality of partitioning wall patterns 200 may have a substantially straight bar-like shape. However, exemplary embodiments of the present invention are not limited thereto, and length and width of the plurality of partitioning wall patterns 200 may vary.

The plurality of partitioning wall patterns 200 may be spaced apart from one another by a predetermined distance.

Referring to FIGS. 13A and 14A, the plurality of partitioning wall patterns 200 may be a predetermined distance apart from one another. A distance between the plurality of partitioning wall patterns 200 disposed on the contracted flexible substrate 100 may be smaller than a distance between the plurality of partitioning wall patterns 200 disposed on the elongated flexible substrate 100'. As the elongated flexible substrate 100' having the plurality of partitioning wall patterns 200 disposed thereon is contracted by removing physical forces applied to the flexible substrate 100, the distance between the plurality of partitioning wall patterns 200 may be reduced. The plurality of partitioning wall patterns 200 disposed on the flexible substrate 100 may be spaced apart from one another; however, exemplary embodiments of the present invention are not limited thereto. The plurality of partitioning wall patterns 200 may directly contact each other according to lengths or shapes thereof.

The partitioning wall patterns 200 may include a material that is less elastic than a material included in the flexible substrate 100. For example, the partitioning wall patterns 200 may include a metal or a polymer material. The partitioning wall patterns 200 may be less elastic than the flexible substrate 100. The partitioning wall patterns 200 may be relatively rigid as compared to the flexible substrate 100.

According to the method of manufacturing a display apparatus according to an exemplary embodiment of the present invention, efficiency of light emitted by the LED 300 may be increased in a display apparatus based on the structure of the flexible substrate 100 including the concavo-convex portion 100*a* without a separate reflective structure disposed on the flexible substrate 100.

According to one or more exemplary embodiments of the present invention, a display apparatus with increased optical efficiency that may be manufactured in a simplified manufacturing process and a method of manufacturing the same may be provided.

It should be understood that exemplary embodiments of the present invention described herein should be considered in a descriptive sense and not for purposes of limitation. Descriptions of features or aspects within each exemplary embodiment should typically be considered as available for other similar features or aspects in other exemplary embodiments.

While one or more exemplary embodiments of the present invention have been described with reference to the figures, it will be understood by those of ordinary skill in the art that various changes in form and details may be made therein without departing from the spirit and scope of the present invention.

What is claimed is:

1. A display apparatus, comprising:
    a flexible substrate comprising a concavo-convex portion and having a first elasticity;
    a light-emitting diode (LED) disposed on the concavo-convex portion; and
    a partitioning wall pattern substantially surrounding the LED at a predetermined distance from the LED in a plan view, the partitioning wall pattern having a second elasticity less than the first elasticity.

2. The display apparatus of claim 1, wherein a portion of the concavo-convex portion is concavely recessed, and
    the LED is disposed on the concavely recessed portion of the concavo-convex portion.

3. The display apparatus of claim 1, wherein the partitioning wall pattern is disposed on the concavo-convex portion.

4. The display apparatus of claim 3, wherein the partitioning wall pattern has a closed loop shape or a closed polygonal shape substantially surrounding the LED in a plan view.

5. The display apparatus of claim 3, further comprising a thin-film transistor above the flexible substrate and electrically connected to the LED wherein the thin-film transistor is arranged at a location corresponding to an area surrounded by the partitioning wall pattern.

6. The display apparatus of claim 1, wherein the partitioning wall pattern is positioned on a protruding portion of the concavo-convex portion.

7. The display apparatus of claim 6, further comprising a thin-film transistor above the flexible substrate and electrically connected to the LED, wherein the thin-film transistor is arranged between the flexible substrate and the LED in correspondence to the LED.

8. The display apparatus of claim 1, wherein the partitioning wall pattern comprises a metal material or a polymer material.

* * * * *